United States Patent [19]
Maemura

[11] Patent Number: 5,084,907
[45] Date of Patent: Jan. 28, 1992

[54] TWO-MODULUS VARIABLE FREQUENCY-DIVIDER CIRCUIT

[75] Inventor: Kosei Maemura, Itami, Japan

[73] Assignee: Mitsubishi Denki Kabushiki Kaisha, Tokyo, Japan

[21] Appl. No.: 439,835

[22] Filed: Nov. 21, 1989

[30] Foreign Application Priority Data

May 8, 1989 [JP] Japan .................................. 1-114518

[51] Int. Cl.$^5$ ..................... H03K 21/08; H03K 21/40; H03K 23/48
[52] U.S. Cl. ......................................... 377/28; 377/48; 377/55; 377/56
[58] Field of Search ..................... 377/56, 114, 116, 28, 377/55, 47, 48

[56] References Cited

U.S. PATENT DOCUMENTS

| | | | |
|---|---|---|---|
| 3,560,723 | 2/1971 | Kamachi | 377/56 |
| 4,090,191 | 5/1978 | Kinbara | 377/28 |
| 4,394,769 | 7/1983 | Lull | 377/48 |
| 4,611,337 | 9/1986 | Evans | 377/116 |
| 4,658,406 | 4/1987 | Pappas | 377/114 |
| 4,741,006 | 4/1988 | Yamaguchi et al. | 377/116 |

OTHER PUBLICATIONS

EDN Oct. 1, 1970, John Nichols & Charles Shinn "Pulse Swallowing", pp. 39–42.
IEDM, Dec. 1–4, 1985, Maemura et al., "Dual Modulus GaAs Precaler IC", pp. 94–96.

Primary Examiner—John S. Heyman
Attorney, Agent, or Firm—Morrison Law Firm

[57] ABSTRACT

A two-modulus variable frequency-divider circuit comprises a variable frequency-divider, a plurality of ÷2 frequency-dividers succeeding the variable frequency-divider, and a monitor. Outputs of one or more of the ÷2 frequency-dividers are coupled to the monitor which develops a monitor output determined by the states of the ÷2 frequency-divider outputs applied thereto. The monitor output is fed back to the variable frequency-divider as a frequency dividing factor setting signal. The two-modulus variable frequency-divider circuit is further provided with a signal converting circuit having a signal inverting function, which can selectively invert, in accordance with an externally applied control signal, the output of the two-modulus variable frequency-divider circuit or the output of the final one of those ÷2 frequency dividers which provide the outputs thereof to the monitor.

11 Claims, 6 Drawing Sheets

TWO-MODULUS VARIABLE FREQUENCY-DIVIDER CIRCUIT

This invention, relates to a variable frequency-divider circuit and, more particularly, to a two-modulus variable frequency-divider circuit for use in, for example, a phase-lock-loop (PLL) type frequency synthesizer for a radio receiver.

BACKGROUND OF THE INVENTION

Many radio receivers such as FM receivers for receiving radio waves at relatively high frequencies, such as frequencies expressed in megahertz (MHz) or gigahertz (GHz), employ a frequency synthesizer for deriving, with stability and high precision, individual ones of a plurality of signals having mutually discrete frequencies (i.e. frequencies spaced from each other). In general, in such a frequency synthesizer, an oscillation frequency of a voltage-controlled oscillator (VCO) is frequency divided by means of a two-modulus variable frequency-divider circuit, an output of the frequency-divider is further frequency divided by means of a programmable frequency-divider circuit, and the VCO is controlled so that the frequency of the output of the programmable frequency-divider circuit becomes equal to a reference frequency. In such an arrangement, the frequency dividing factor of the programmable frequency divider circuit is properly selected such that a signal having a desired one of said plurality of discrete frequencies can be selectively derived from the VCO. A two-modulus frequency-divider circuit is a frequency-divider which has two frequency dividing factors selectable by a control signal and which can operate at a relatively high speed. Accordingly, in a PLL, it is usually disposed in a stage preceding a low-speed programmable frequency-divider circuit which is poorly responsive to high frequencies (e.g. frequencies of several hundred megahertz) supplied from a VCO, so that the oscillation frequency of the VCO is applied to the programmable frequency-divider circuit after it is divided by the two-modulus frequency-divider circuit.

FIG. 1 shows a typical example of conventional PLL frequency synthesizers. The frequency synthesizer of FIG. 1 comprises a two-modulus variable frequency-divider circuit (2-modulus V.F.D.) 1 which can divide the frequency of an input signal by either one of two factors, N and N+K, a programmable frequency-divider circuit (programmable F.D.) 2 having a variable frequency dividing factor M, a phase comparator circuit 3, a reference signal generator 4, and a voltage controlled oscillator (VCO) 5. $f_0$ is an oscillation frequency of the VCO 5. $f_1$ is an output frequency of the two-modulus variable frequency-divider 1. $f_2$ is an output frequency of the programmable frequency-divider 2. $f_r$ is a reference frequency which is equal to the frequency of an output signal of the reference signal generator 4. $V_c$ is an output voltage of the phase comparator 3. MOD is a signal which is used to switch the frequency dividing factor of the two-modulus variable frequency-divider circuit 1 between N and N+K. Usually, a loop filter is disposed between the phase comparator 3 and the VCO 5, but it is not shown in FIG. 1 for simplicity.

Next, the operation of the PLL frequency synthesizer of FIG. 1 is explained. The oscillation frequency $f_0$ of the VCO 5, which is the frequency of the output signal of the PLL frequency synthesizer, is divided by N or N+K in the two-modulus variable frequency-divider circuit 1 to form the frequency $f_1$, which in turn is divided by M in the programmable frequency-divider circuit 2 which provides the frequency $f_2$. The output $f_2$ is applied to one input of the phase comparator 3, where it is compared with the reference signal frequency $f_r$ applied to the other input from the reference signal generator 4. When $f_0$ is lower than a desired preset frequency, $f_2$ becomes lower than $f_r$ and the output voltage $V_c$ of the phase comparator 3 rises accordingly. Then, the output frequency $f_0$ of the VCO 5 which is controlled by the output voltage $V_c$ rises accordingly. On the other hand, when $f_0$ is higher than the desired frequency, $f_2$ becomes higher than $f_r$ and the output voltage $V_c$ of the phase comparator 3 becomes lower accordingly, which decreases the oscillation frequency $f_0$ of the VCO 5. When $f_0$ becomes equal to the desired preset frequency through the process as stated above, $f_2$ and $f_r$ become substantially equal so that the output voltage $V_c$ of the phase comparator 3 becomes stable. Thus, the oscillation frequency $f_0$ of the VCO 5 also becomes stable.

Next, the operations of the above-stated two-modulus variable frequency-divider circuit 1 and the programmable frequency-divider circuit 2 are explained. First, the functions of the two frequency-divider circuits are considered. Let it be assumed that the two-modulus variable frequency-divider circuit 1 has frequency dividing factors of N and N+1 (i.e. K=1). In the PLL frequency synthesizer of FIG. 1, the output frequency $f_0$, which is the oscillation frequency of the VCO 5, is an integral multiple of the reference frequency $f_r$. Thus, if $f_0$ can be expressed by the following equation, in which L is an integer, a frequency equal to $f_r$ can be obtained by dividing $f_0$ by L.

$$f_0 = f_r \times L \tag{1}$$

This means that the PLL frequency synthesizer must be able to divide $f_0$ by a desired integer. L can be expressed by two positive integers M1 and M2, where M1 > M2, and N (a frequency dividing factor), as $$L = M1 \times N + M2 \tag{2}$$

The equation (2) can be transformed into $$L = (M1 - M2) \times N + M2 \times (N + 1) \tag{3}$$

From the equation (3), it is seen that the frequency division by N (÷N frequency division) is equivalent to frequency dividing by means of two frequency dividers which respectively have frequency dividing factors N and (M1−M2), switching these factors to (N+1) and M2, respectively, and further frequency dividing by means of the same frequency dividers with their respective factors (N+1) and M2. The two-modulus variable frequency-divider circuit and the programmable frequency-divider circuit serve as the above-stated two frequency dividers. In practice, an input frequency is divided by the frequency dividing factor N in the two-modulus variable frequency-divider circuit and then its output is counted to a count 1 (M1−M2) by the programmable frequency divider. When the programmable frequency divider reaches (M1−M2), the frequency dividing factor of the two-modulus variable frequency-divider circuit is switched to (N+1) and its output is counted further by the programmable frequency divider. When the count of the programmable frequency divider reaches M2, an output is developed. The result is the desired frequency division. When the programmable frequency-divider counts (M1−M2) for the output of the two-modulus variable frequency-divider circuit, it immediately produces an MOD signal shown in FIG. 1 so as to switch the frequency dividing factor of the two-modulus variable frequency-divider circuit from N to (N+1). Thus, these two frequency-divider circuits can divide the input signal frequency by any desired integer, and, accordingly, this frequency synthesizer can produce an output frequency of any desired multiple of the reference frequency.

Next, a two-modulus variable frequency-divider circuit is described. FIG. 2 shows an example of a two-modulus variable frequency-divider circuit, which has a frequency dividing factor switchable between sixteen (16) and seventeen (17). In FIG. 2, the two-modulus variable frequency-divider circuit comprises a dual-mode frequency-divider 11 having frequency dividing factors of 4 and 5, two divide-by-two (÷2) frequency dividers 12 and 13 which form a divide-by-$2^N$ (÷$2^N$) frequency divider-arrangement where N is an integer and two (2) in this case, an OR circuit 14, an output buffer circuit 16, a signal input terminal IN, an input terminal MOD for receiving a frequency dividing factor switching signal, and an output terminal OUT. N1 is an output of the dual-mode frequency divider circuit section 11. N2 and N3 are outputs of the ÷2 frequency-dividers 12 and 13, respectively. N4 is an output of the OR circuit 14. T's are clock input terminals of the respective frequency-dividers. Q's are output terminals of the respective frequency-dividers. MD is a terminal of the dual-mode frequency-divider 11 to which a frequency dividing factor setting signal is applied.

In operation, the dual-mode frequency-divider 11 operates as a divide-by-five (÷5) frequency-divider when the signal N4, which is the frequency dividing factor setting signal applied to the terminal MD, is "LOW", while it operates as a divide-by-four (÷4) frequency-divider when the signal N4 is "HIGH". In terms of inputs and an output to and from the OR circuit 14, only when the signal MOD, which is applied to the OR circuit 14 from a succeeding programmable frequency-divider circuit (not shown in FIG. 2), is LOW and both N2 and N3 are LOW, the output signal N4 of the OR circuit 14 is LOW and the dual-mode frequency-divider 11 performs ÷5 frequency dividing operation. In this case, the two-modulus frequency-divider circuit as a whole divides the input frequency by (5+4×3)=17. On the other hand, when the signal MOD is HIGH, the output N4 of the OR circuit 14 is always HIGH, so that the dual-mode frequency divider 11 performs ÷4 frequency dividing operation and, accordingly, the two-modulus frequency-divider circuit as a whole frequency divides the input signal by (4×4)=16. In other words, the two-modulus frequency-divider circuit acts as a ÷16 frequency-divider circuit.

The above-described operation is further explained with reference to waveforms illustrated in FIG. 3. FIG. 3 shows the timing relationship between the output signal of the two-modulus variable frequency-divider circuit (FIG. 2) and the output signals of the respective constituent circuits, where each of the frequency-divider circuits 11, 12 and 13 comprises a master-slave flip-flop which produces a transition in its output when an input thereto changes to HIGH. In FIG. 3, a waveform IN is of the input signal and waveforms N1, N2 and N3 are of the output signals of the respective constituent circuits 11, 12 and 13, and the output N3 is substantially the same as the output OUT of the two-modulus variable frequency-divider circuit. N4 is the output signal of the OR circuit 14. T1 is a time interval from a time when the output OUT changes from HIGH to LOW to a time when both of the output signals N2 and N3 of the constituent circuits 12 and 13 go LOW, and T2 is a time interval from a time when the signal OUT changes from LOW to HIGH to a time when both of the output signals N2 and N3 become LOW. As stated previously, when the signal MOD is HIGH, N4 is always HIGH and, therefore, the two-modulus variable frequency-divider circuit provides ÷16 frequency division. In this case, the duration of each of HIGH and LOW states of the output signal OUT corresponds to eight (8) periods of the input signal IN. When MOD is LOW, the two-modulus variable frequency-divider circuit provides ÷17 frequency division. However, because N4 assumes the LOW state when the output signal OUT is in the LOW state, the duration when OUT is HIGH is eight periods of the input signal IN and the duration when OUT is LOW is nine periods of the input signal IN. Whether the two-modulus variable frequency-divider circuit acts as a ÷16 frequency-divider circuit or as a ÷17 frequency-divider circuit is determined by whether the MOD signal applied to the OR circuit 14 is HIGH or LOW when the signals N2 and N3 are both LOW.

In order for the MOD signal to be able to switch the frequency dividing factor of the two-modulus variable frequency-divider circuit between 16 and 17, the MOD signal must be applied to the OR circuit 14 before both of the signals N2 and N3 change to LOW. As shown in FIG. 1, the MOD signal is provided by the succeeding programmable frequency-divider circuit. The programmable frequency-divider circuit changes the state of the MOD signal after it has counted the output signal OUT of the two-modulus variable frequency-divider circuit. Accordingly, if the programmable frequency-divider circuit is of the type which detects a transition of the output signal OUT from the HIGH state to the LOW state, the switching of the state of the MOD signal must be done within the time interval of T1. On the other hand, if the programmable frequency-divider circuit is of the type which detects a transition from LOW to HIGH of the output signal OUT, the switching of the state of the MOD signal must be done within the time interval of T2.

In a conventional two-modulus variable frequency-divider circuit employing the arrangement shown in FIG. 2, the time intervals T1 and T2 available for switching the state of the MOD signals when the above-stated two types of the programmable frequency-divider circuits are used are considerably different from each other. For example, one may be more than twice as long as the other. In applications where the operation frequency of the two-modulus variable frequency-divider circuit is high, the time intervals available for the MOD signal state switching are also shorter, as a matter of course. Accordingly, in high frequency applications, the time intervals available for the MOD signal state switching are very important. For example, in the combination of the two-modulus variable frequency-divider circuit shown in FIG. 2 and the programmable frequency-divider circuit of the type which detects the change of from HIGH to LOW of the output signal OUT, the time interval available to the programmable frequency-divider circuit for switching the state of the MOD signal is the shorter time interval T1. Therefore, if a PLL frequency synthesizer is constructed by a two-modulus variable frequency-divider circuit and a programmable frequency-divider circuit of the above-stated type which cannot switch the state of the MOD signal at a high speed, the MOD signal state switching within the time interval of T1 may, disadvantageously, not be reliably done, which causes the two-modulus variable frequency-divider circuit not to have a correct frequency dividing factor and the frequency-divider output frequency deviates from a desired one.

SUMMARY OF THE INVENTION

Therefore an object of the present invention is to provide an improved two-modulus variable frequency-divider circuit suitable for high frequency applications.

Another object of the present invention is to provide an improved two-modulus variable frequency-divider circuit which can provide desired frequency division by a correct dividing factor even when input signals are high frequency band signals.

Still another object of the present invention is to provide a two-modulus variable frequency-divider circuit which comprises a variable frequency-divider, a plurality of $\div 2$ frequency-dividers, a monitor for monitoring states of outputs from at least one of said $\div 2$ frequency-dividers, and means for feeding back an output of the monitor to said variable frequency divider as a frequency dividing factor setting signal. It is arranged such that the output of the two-modulus variable frequency-divider circuit is capable of being selectively inverted so that a correct frequency dividing factor setting signal can be generated, which enables the circuit to reliably perform desired frequency dividing operation even in high frequency regions.

A further object of the present invention is to provide a two-modulus variable frequency-divider circuit which is suitable for use as a component of, for example, a PLL frequency synthesizer and the like, together with a programmable frequency-divider circuit, and of which the frequency dividing factor can be established reliably to thereby provide a desired frequency output with stability.

A still further object of the present invention is to provide a two-modulus variable frequency-divider circuit which can highly reliably perform frequency dividing operation in relation to the operation speed of the succeeding programmable frequency-divider circuit, even in relatively high frequency regions.

And, a still further object of the present invention is to provide a two-modulus variable frequency-divider circuit which can perform stable frequency dividing operation in relatively high frequency regions even when the succeeding programmable frequency-divider circuit, which takes part in setting the frequency dividing factor of the variable frequency-divider, has a relatively low operating speed.

According to the present invention, a two-modulus variable frequency-divider circuit is provided with a circuit, in its output, which can invert an output of the two-modulus variable frequency-divider circuit in accordance with a particular signal externally applied thereto. Alternatively, the two-modulus variable frequency-divider circuit is provided with a circuit, in a feedback path from the final stage flip-flop to a dual-mode frequency-divider, which can invert a feedback signal in accordance with a particular signal externally applied thereto.

A two-modulus variable frequency-divider circuit, embodying a first aspect of the present invention, comprises a variable frequency-divider having a frequency dividing factor that can be selectively set to a particular value in response to a frequency dividing factor setting signal, a $\div 2^N$ frequency-divider arrangement (N being an integer) succeeding said variable frequency-divider and comprising a plurality, N, of $\div 2$ frequency-dividers, a monitor that monitors an output of at least one of said $\div 2$ frequency dividers in said extension, and a circuit that feeds an output of said monitor back to said variable frequency-divider as said frequency dividing factor setting signal. An output signal converting circuit is provided between said extension and an output of the two-modulus variable frequency-divider circuit. The output signal converting circuit is operable to invert the output from said extension so as to match the characteristic of a succeeding circuit, in accordance with a particular signal externally applied thereto.

A two-modulus variable frequency-divider circuit, embodying a second aspect of the present invention, comprises a variable frequency-divider having a frequency dividing factor that can be selectively set to a particular value in response to a frequency dividing factor setting signal, a $\div 2^N$ frequency-divider arrangement (N being an integer) succeeding said variable frequency-divider and comprising a plurality, N, of $\div 2$ frequency-dividers, a monitor that monitors an output of at least one of said $\div 2$ frequency dividers, and a circuit that feeds an output of said $\div 2^N$ frequency-divider arrangement back to said variable frequency-divider as said frequency dividing factor setting signal, wherein an output signal applied from the final one of those $\div 2$ frequency-dividers of said $\div 2^N$ frequency-divider arrangement of which outputs are applied to said monitor is applied through a signal converting circuit that performs selective signal inversion in accordance with a control signal externally applied thereto.

The signal converting circuit is capable of inverting, as required, the signal applied to the circuit succeeding the two-modulus variable frequency-divider circuit or the signal applied from the final $\div 2$ frequency-divider to the monitor, in accordance with a particular signal externally applied to the signal inverting circuit, whereby the duration of a time interval from an occurrence of a transition from LOW to HIGH or from HIGH to LOW of the output of the two-modulus variable frequency-divider available for switching the state of the MOD signal can be changed. Thus, either one of two, longer and shorter, durations can be selected for preparation for switching the state of the MOD signal so as to match the operation characteristic of the succeeding programmable frequency-divider circuit.

BRIEF DESCRIPTION OF THE DRAWINGS

Throughout the drawings, the similar reference numerals and symbols denote similar items or functions.

DETAILED DESCRIPTION OF THE INVENTION

Figure 4A:
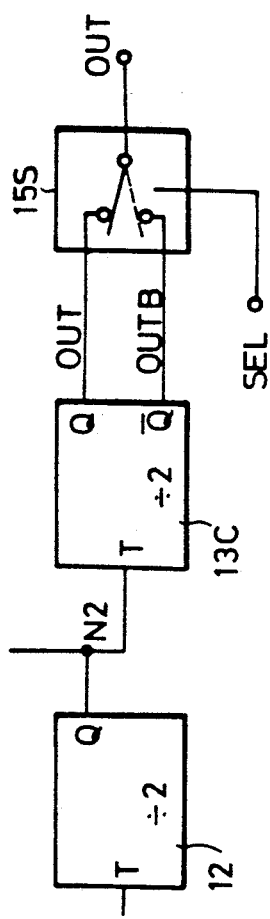
FIG. 4A shows a modification of the two-modulus variable frequency-divider circuit shown in FIG. 4.
Figure 4:
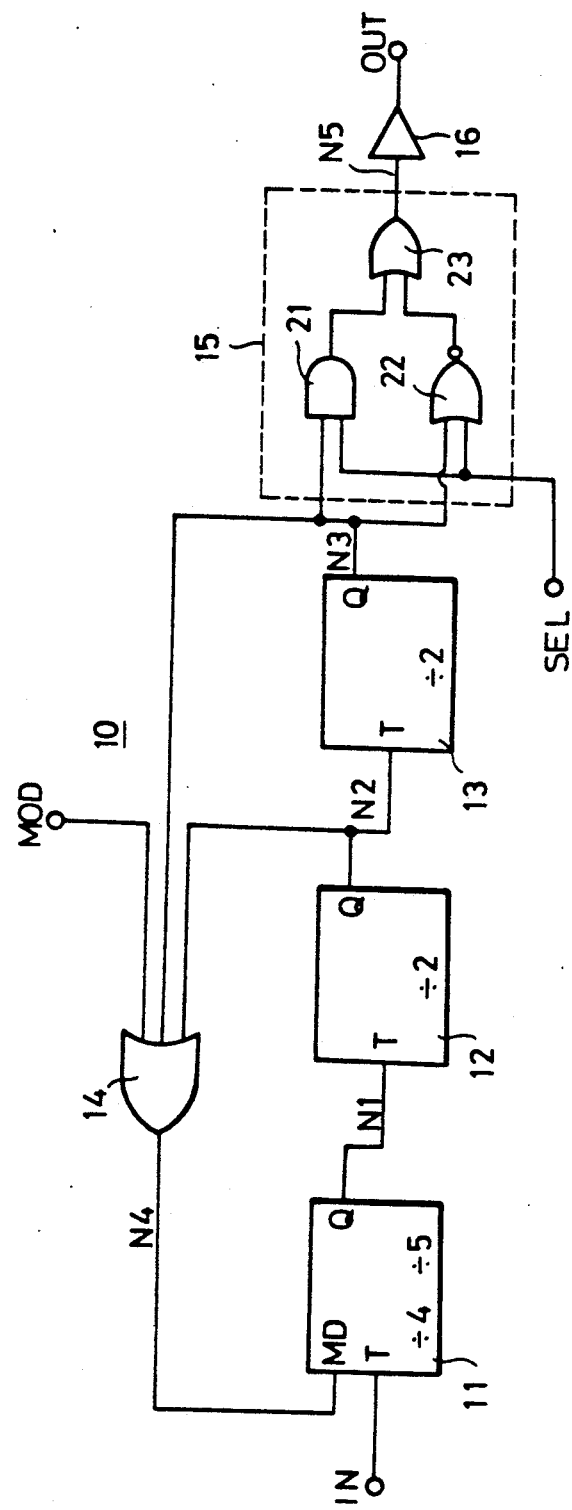
FIG. 4 is a circuit diagram showing, partially in block, a structure of a two-modulus variable frequency-divider circuit according to one embodiment of the present invention.

In FIG. 4, a two-modulus variable frequency-divider circuit 10 according to one embodiment of the present invention is shown. The circuit 10 has a frequency dividing factor which can be switched between sixteen (16) and seventeen (17). That is, this circuit 10 operates as a ÷16 frequency-divider and as a ÷17 frequency-divider. The two-modulus variable frequency-divider circuit 10 of FIG. 4 comprises a dual-mode frequency-divider 11 which has frequency dividing factors of 4 and 5, two ÷2 frequency-dividers 12 and 13 which form a ÷$2^N$ frequency-divider arrangement (N being an integer and two in the illustrated example), an OR circuit 14 which operates as a monitor for an output of at least one of the ÷2 frequency-dividers 12 and 13, a signal inverting circuit 15, and an output buffer circuit 16. The signal inverting circuit 15 comprises an AND circuit 21, a NOR circuit 22 and an OR circuit 23. IN is a signal input terminal of the two-modulus variable frequency-divider circuit 10. MOD is a frequency dividing factor switching signal (MOD signal) input terminal. OUT is an output terminal of the two-modulus variable frequency-divider circuit 10. T's and Q's are input and output terminals of the respective frequency-dividers 11, 12 and 13. MOD is a frequency dividing factor setting signal input of the dual-mode frequency-divider 11. SEL denotes a terminal for receiving an output inverting signal (SEL signal). N1 is an output of the dual-mode frequency-divider 11. N2 and N3 are outputs of the ÷2 frequency-dividers 12 and 13. N4 is an output of the OR circuit 14 and is applied as the frequency dividing factor setting signal to the dual-mode frequency-divider 11. N5 is an output of the signal inverting circuit 15.

Figure 1:
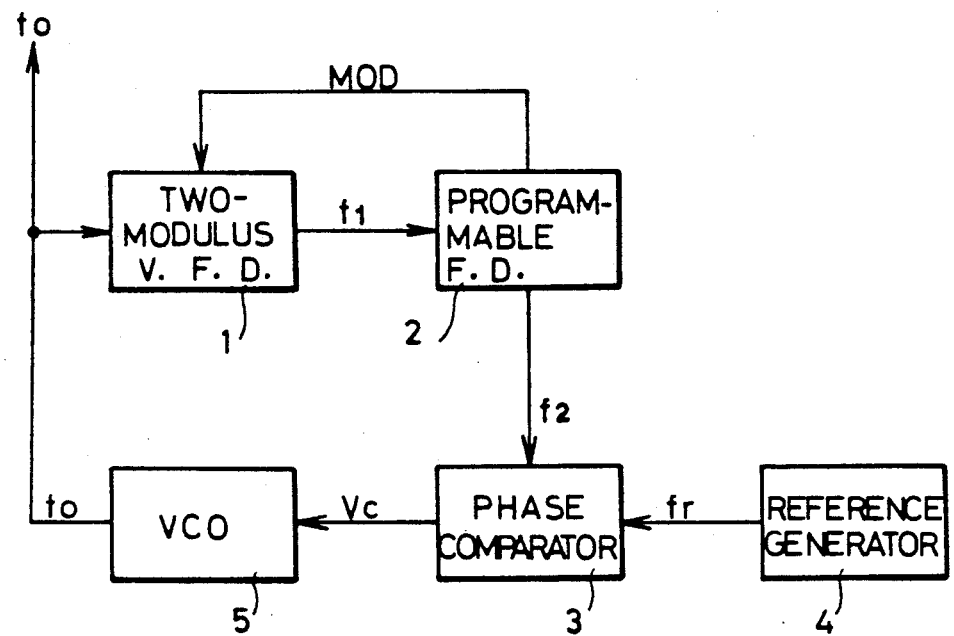
FIG. 1 is a block diagram of a basic structure of a PLL frequency synthesizer.
Figure 2:
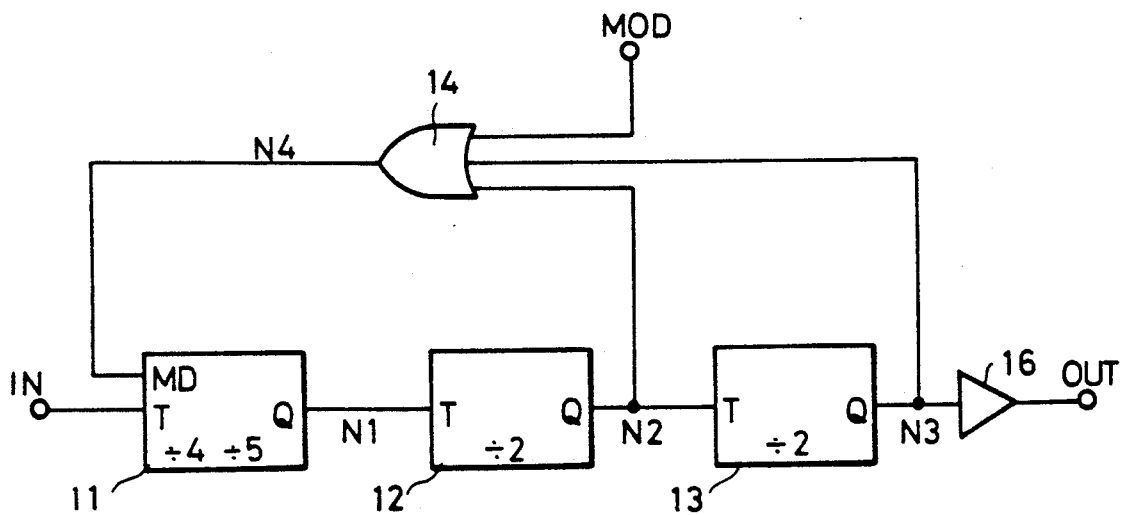
FIG. 2 is a circuit diagram showing, partially in block, a structure of an example of conventional two-modulus variable frequency-dividers.
Figure 3:
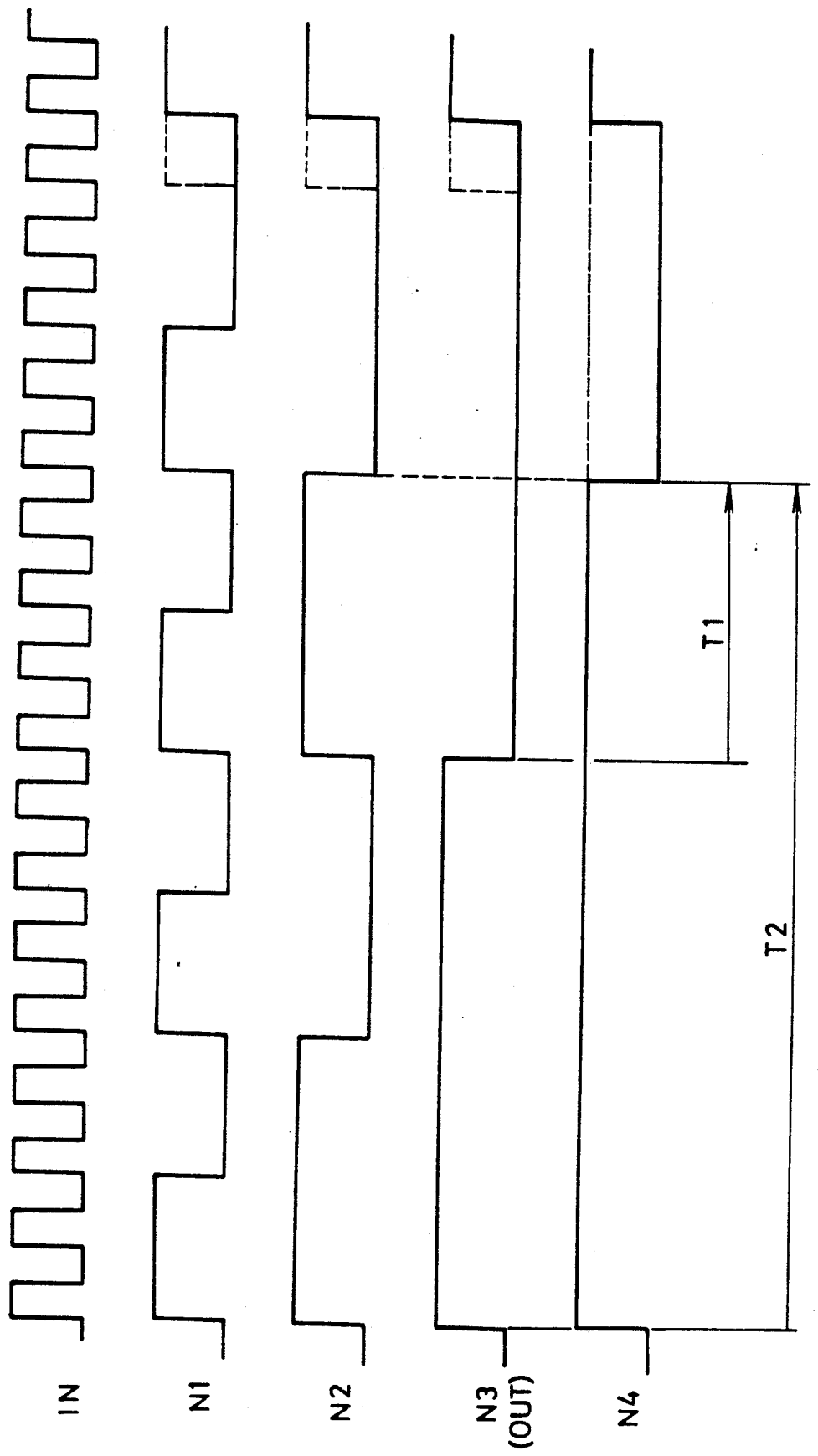
FIG. 3 illustrates waveforms of outputs of respective constituent circuits of the two-modulus variable frequency-divider circuit of FIG. 2.

In operation, when the MOD signal from a succeeding programmable frequency-divider (not shown) is LOW and the outputs N2 and N3 are both LOW, the output of the OR circuit 14 is LOW so as to cause the dual-mode frequency-divider 11 to operate as a ÷5 frequency-divider. As a result, the two-modulus variable frequency-divider circuit 10 as a whole provides ÷17 frequency division. The output N4 is HIGH whenever the MOD signal is HIGH, so that the dual-mode frequency-divider 11 acts as a ÷4 frequency-divider. Then, the two-modulus variable frequency-divider circuit 10 as a whole acts as a ÷16 frequency-divider circuit. The operation of the circuit thus far described is similar to that of the conventional two-modulus variable frequency-divider circuit explained with reference to FIG. 2.

The circuit 10 of the present invention, however, is provided with the signal inverting circuit 15 as a signal converting circuit. Depending on whether the input SEL signal applied to the signal inverting circuit 15 is HIGH or LOW, the state of the output N5 of the circuit 15 and, hence, the signal at the terminal OUT changes. Specifically speaking, the output N5 of the circuit 15 is the output N3 as it is, which has passed through the AND circuit 21 and the OR circuit 23, when the SEL signal is HIGH. On the other hand, if the SEL signal is LOW, the output N5 is an inverted version of the output N3 which has passed through the NOR circuit 22 and the OR circuit 23.

Figure 5:
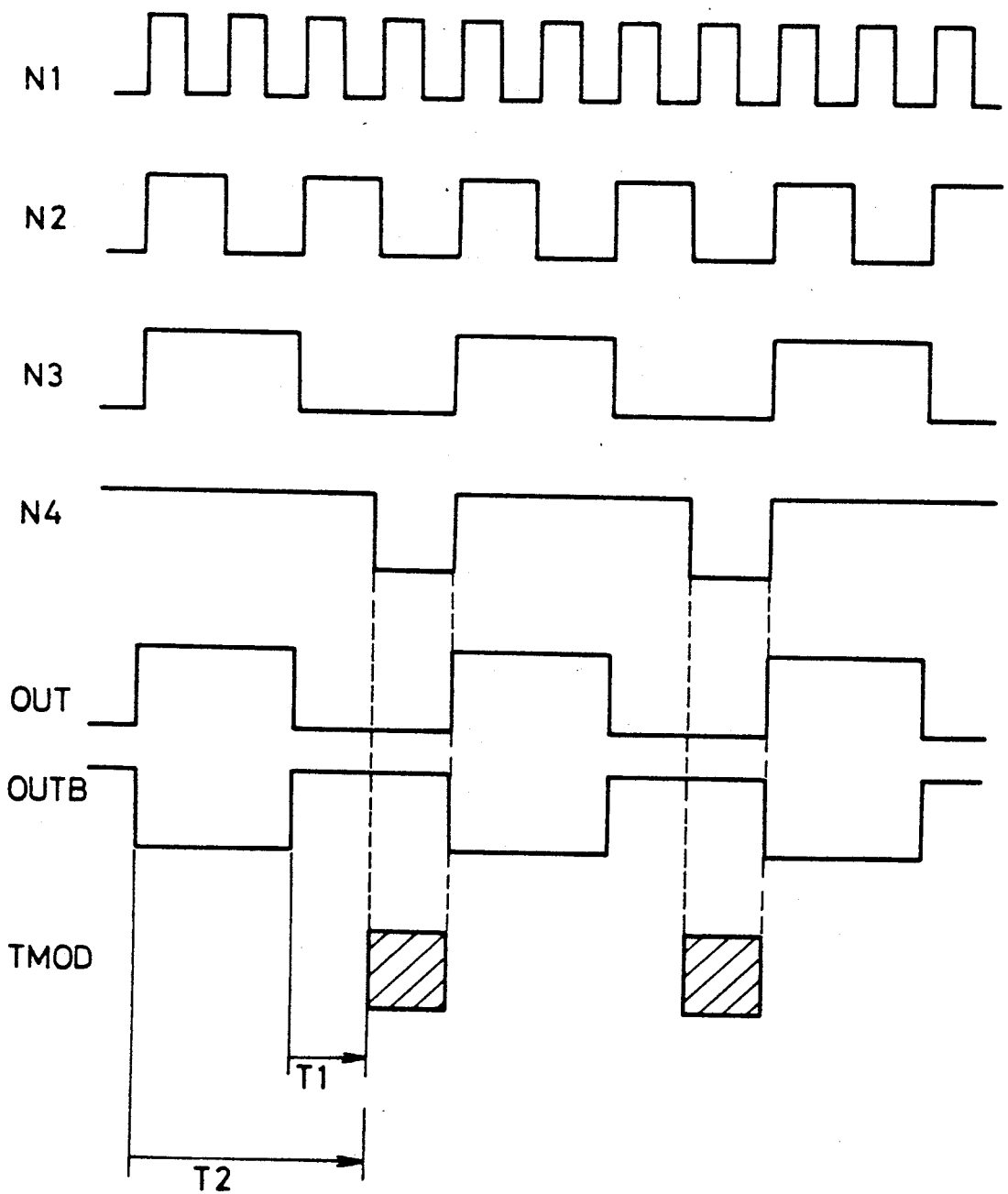
FIG. 5 illustrates waveforms of outputs of respective constituent circuits of the two-modulus variable frequency-divider circuit of FIG. 4.

The operation of the circuit 10 is further explained with reference to the waveforms of the outputs of the respective constituent circuit portions shown in FIG. 5. In FIG. 5, N1 is the output of the dual-mode frequency-divider 11, N2 and N3 are the respective outputs of the ÷2 frequency-dividers 12 and 13, and N4 is the output of the OR circuit 14 when the MOD signal is LOW. OUT is the output signal of the two-modulus variable frequency-divider circuit 10, and OUTB is the inverted version of the output signal OUT. In other words, OUT is the output signal developed by the two-modulus variable frequency-divider circuit 10 when the SEL signal is HIGH, whereas OUTB is the output signal developed by the two-modulus variable frequency-divider circuit when the SEL signal is LOW. A hatched square labeled "TMOD" in FIG. 5 denotes the time interval during which the output N4 is LOW. The time interval TMOD is a time available to the two-modulus variable frequency-divider circuit 10 for determining whether the MOD signal is HIGH or LOW and set the frequency dividing factor in accordance with the determined state of the MOD signal. T1 is a time period from a transition of OUT from HIGH to LOW to the beginning of TMOD, and T2 is a time period from a transition of OUT from LOW to HIGH to the beginning of TMOD. In view of OUTB, T1 and T2 are time periods to the beginning of TMOD from the transition from LOW to HIGH and from the transition from HIGH to LOW, respectively.

In a frequency synthesizer employing the above-described two-modulus variable frequency-divider circuit, if a programmable frequency-divider circuit used in combination with the two-modulus variable frequency-divider circuit is of the type which responds to a transition from LOW to HIGH of the output of the two-modulus variable frequency-divider circuit, the SEL signal is fixed to HIGH so that the output signal of the two-modulus variable frequency-divider circuit is as illustrated by OUT in FIG. 5, whereby the time period available to the programmable frequency-divider circuit for switching the state of the MOD signal is T2. On the other hand, if the programmable frequency-divider circuit is of the type which responds to a transition from HIGH to LOW of the output of the two-modulus variable frequency-divider circuit, the time period available for switching the state of the MOD signal, when the SEL signal is HIGH, is T1, which is substantially shorter than the time period T2. In such a case, the SEL signal is fixed to LOW. Then, the output signal of the two-modulus variable frequency-divider circuit is OUTB shown in FIG. 5, so that the time period available for switching the state of the signal MOD is T2 which is substantially longer than the time period T1. Thus, the programmable frequency-divider circuit need not have a high-speed MOD signal switching characteristic.

In FIG. 4, the signal inverting circuit 15 is used as a signal converting circuit for selectively providing either output signal OUT or OUTB. If, however, the final stage flip-flop of the two-modulus variable frequency-divider circuit 10 is of the type which has a positive signal terminal Q and an inverted signal terminal $\overline{Q}$ and can provide the both signals OUT and OUTB individually, as illustrated in FIG. 4A, a switcher circuit 15S instead of the signal inverting circuit 15 may be used as the signal converting circuit. The switcher circuit 15S is connected between the non-inverted and inverted signal terminals Q and $\overline{Q}$ and the output terminal OUT and can be selectively switched by the SEL signal to provide either one of the signals OUT and OUTB depending on whether the SEL signal is HIGH or LOW. In FIG. 4A, a mechanical, single-pole double-throw switch is shown as the switcher circuit 15S, but, in practice, an electronic switch is used.

Whether the level of the SEL signal should be HIGH or LOW depends on the characteristic of the programmable frequency-divider circuit used. In other words, it is dependent on whether the programmable frequency-divider circuit is of the type which detects and responds to a transition of the output of the two-modulus variable frequency-divider circuit from HIGH to LOW or from LOW to HIGH. Accordingly, when the type of the programmable frequency-divider circuit to be used is once determined, the level of the SEL signal is fixed to either HIGH or LOW. A supply voltage or its fraction may be used as the HIGH level of the SEL signal, while the LOW level is provided by ground potential.

Figure 6:
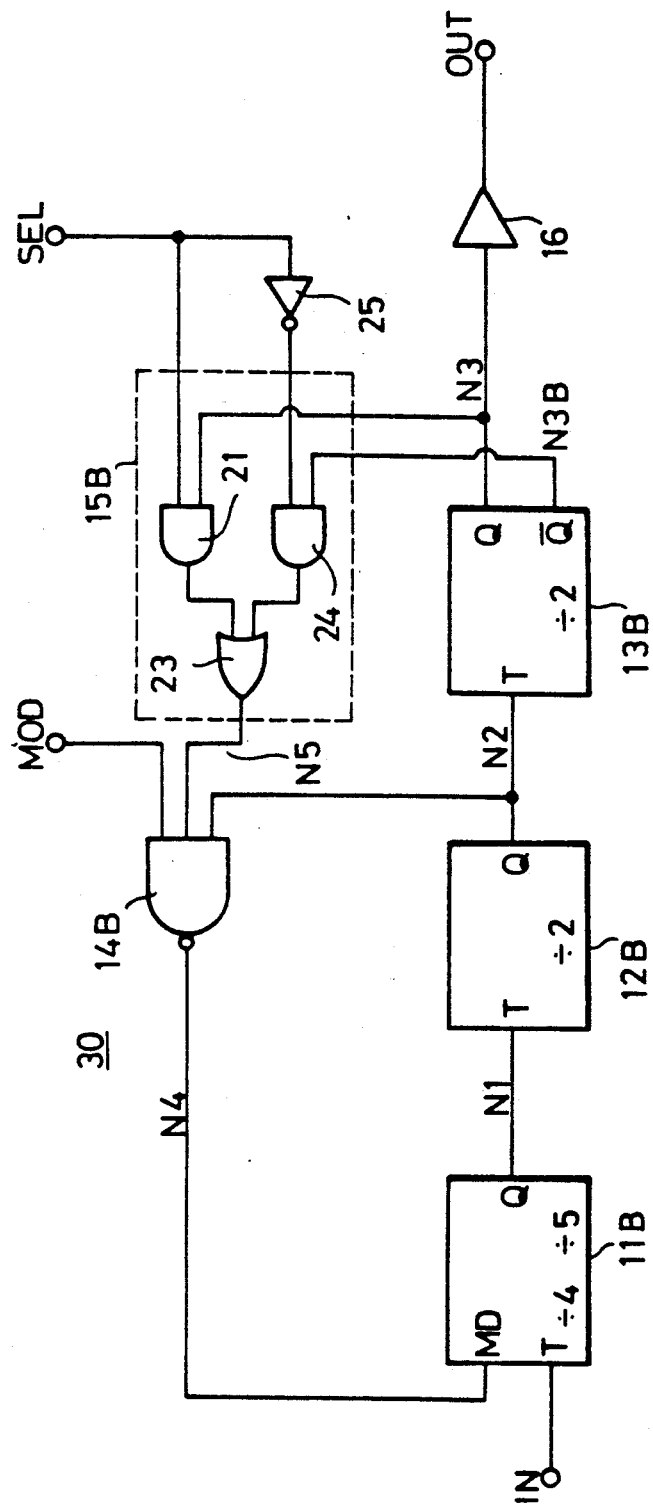
FIG. 6 is a circuit diagram showing, partially in block, a structure of a two-modulus variable frequency-divider circuit according to another embodiment of the present invention.

FIG. 6 illustrates a two-modulus variable frequency-divider circuit 30 according to a second embodiment of the present invention. This circuit 30 has two frequency dividing factors, namely, sixteen (16) and seventeen (17). The two-modulus variable frequency-divider circuit 30 of FIG. 6 comprises a dual-mode frequency-divider 11B having two frequency dividing factors of four (4) and five (5), $\div 2$ frequency-dividers 12B and 13B which constitute a $\div 2^N$ frequency-divider arrangement (N being an integer and two in the example shown in FIG. 6), a NAND circuit 14B operating as a monitor, a signal inverting circuit 15B, an output buffer 16, and an inverter 25. The signal inverting circuit 15B comprises an OR circuit 23, and AND circuits 21 and 24. IN is a signal input terminal. MOD is a frequency dividing factor switching signal (MOD signal) input terminal. OUT is an output terminal of the circuit 30. SEL is a terminal for receiving an output signal inverting signal (SEL signal). N1 is an output of the dual-mode frequency-divider 11B, and N2 and N3 are outputs of $\div 2$ frequency-dividers 12B and 13B, respectively. N3B is an inverted version of N3. N4 is an output of the NAND circuit 14B and is a signal for setting one of the frequency dividing factors of the frequency-divider 11B. N5 is an output of the signal inverting circuit 15B. Each of the frequency-dividers is arranged to change its output in response to a transition from HIGH to LOW of an input signal applied to it. T's are clock input terminals of the respective frequency-dividers. Q and $\overline{Q}$ are non-inverted and inverted output signal terminals of the frequency-divider. MD is a frequency dividing factor setting signal input terminal of the dual-mode frequency-divider 11B.

Next, the operation is briefly described. The difference between two-modulus variable frequency-divider circuit 30 and the conventional one (shown in FIG. 2) is the provision of the signal inverting circuit 15B. When the SEL signal is HIGH, the AND circuit 21 of the inverting circuit 15B is enabled (the AND circuit 24 being disabled) and, therefore, the inverting circuit 15B causes the output N3 at the Q terminal of the $\div 2$ frequency-divider 13B to be developed as the output N5 through the OR circuit 23. When the SEL signal is LOW, the AND circuit 24 is enabled (the AND circuit 21 being disabled) so that the output N3B at the terminal $\overline{Q}$ of the $\div 2$ frequency-divider 13B is developed as N5 through the OR circuit 23. The dual-mode frequency-divider 11B performs divide-by-five ($\div 5$) frequency division when the frequency dividing factor setting signal N4 applied to the terminal MD is LOW, and divide-by-four ($\div 4$) frequency division when the signal N4 is HIGH.

As stated above, when the SEL signal is HIGH, N5 is N3 and, therefore, the NAND circuit 14B produces N4 at LOW level only when the MOD signal from a programmable frequency-divider circuit (not shown) is HIGH and N2 and N3 (N5) are both HIGH and, accordingly, the dual-mode frequency divider 11B acts as a $\div 5$ frequency-divider. Consequently, the circuit 30 as a whole performs frequency division by a factor of $(5+4\times 3)=17$. That is, the circuit 30 acts as a $\div 17$ frequency-divider. When the MOD signal is LOW, N4 is always HIGH due to the action of the NAND circuit 14B and, therefore, the dual-mode frequency-divider 11B always performs $\div 4$ frequency division. Accordingly, the circuit 30 as a whole performs divide-by-sixteen ($\div 16$) frequency division.

When the SEL signal is LOW, N5 is the inverted version of N3, i.e. N3B. Therefore, because of the action of the NAND circuit 14B, only when the MOD signal is HIGH, N2 is HIGH and N3 is LOW (i.e. N3B and, hence, N5 are HIGH), N4 becomes LOW and the dual-mode frequency-divider 11B performs $\div 5$ frequency division. Accordingly, the circuit 30 as a whole performs divide-by-seventeen ($\div 17$) frequency division. On the other hand, when the MOD signal is LOW, N4 is always HIGH and, therefore, the dual-mode frequency-divider 11B performs $\div 4$ frequency division. Accordingly, the circuit 30 as a whole performs divide-by-sixteen ($\div 16$) frequency division.

Figure 7:
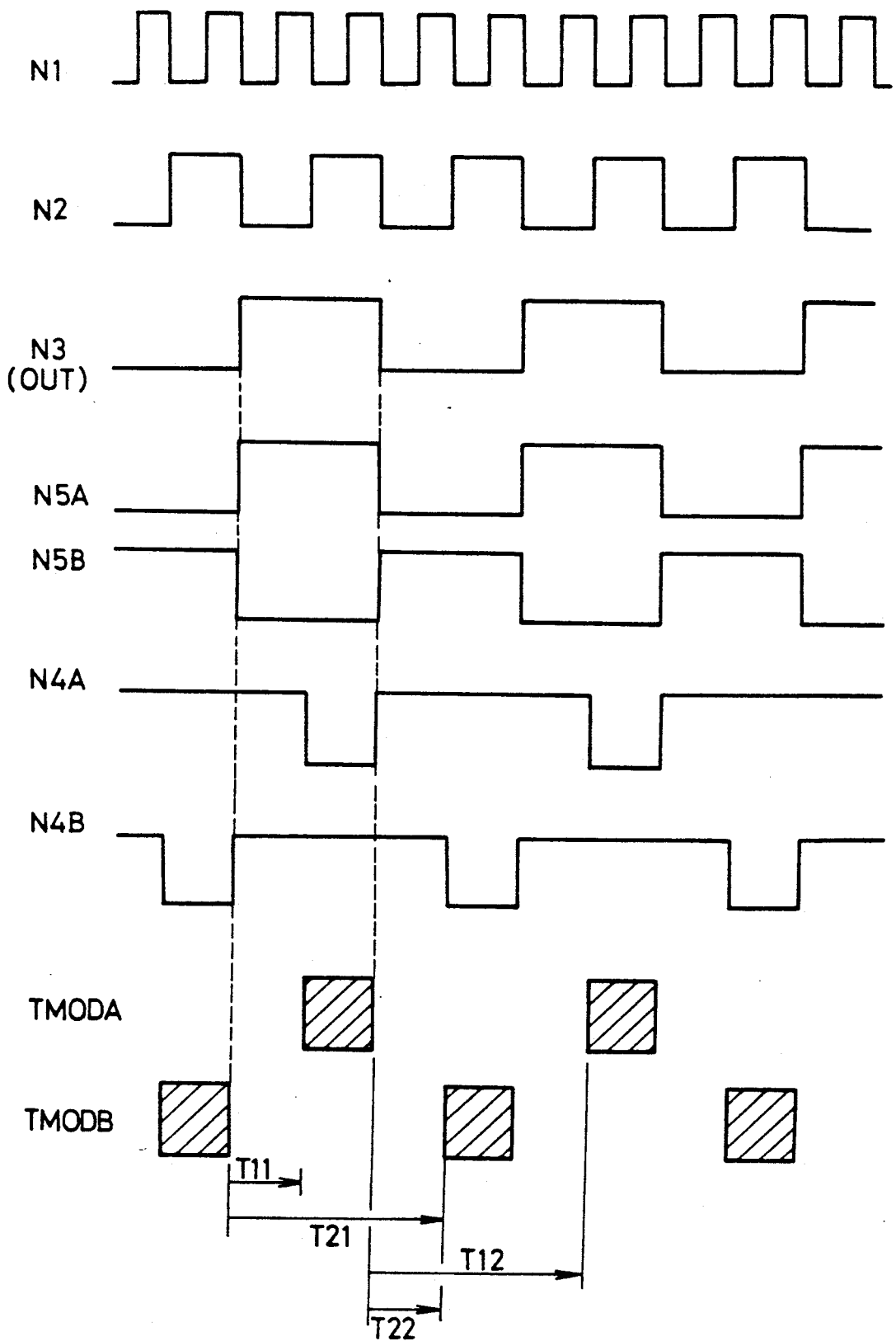
FIG. 7 illustrates waveforms of outputs of respective constituent circuits of the two-modulus variable frequency-divider circuit of FIG. 6.

Next, referring to FIG. 7 illustrating the output waveforms of the constituent circuit portions of the circuit 30, the operation is explained. In FIG. 7, N1, N2 and N3 are the outputs of the respective frequency-dividers, as stated previously. N3 is also the output signal OUT of the two-modulus variable frequency-divider 30. N5A and N5B are outputs from the signal inverting circuit 15B when the SEL signal is HIGH and LOW, respectively. The output signals N5A and N5B are substantially the same as N3 and N3B, respectively. N4A and N4B are the output signals from the NAND circuit 14B when the SEL signal is HIGH and LOW, respectively, with the MOD signal being HIGH.

Hatched squares TMODA and TMODB are time intervals during which N4 (or N4A and N4B) is LOW when the MOD signal is HIGH. TMODA and TMODB represent time periods available to the two-modulus variable frequency-divider for detecting the state of the MOD signal, HIGH or LOW, and selecting its frequency dividing factor. T11, T12, T21 and T22 are time periods available for switching the state of the MOD signal supplied by the programmable frequency-divider (in a frequency synthesizer) after an occurrence of transition of the output OUT (N3) of the two-modulus variable frequency-divider circuit 30. More specifically, T11 is a time period from a transition of the output OUT from LOW to HIGH to the beginning of TMODA, and T21 is a time period to the beginning of TMODB. T12 and T22 are time periods from a transition of the output OUT from HIGH to LOW to the beginnings of TMODA and TMODB, respectively.

As stated previously, TMODA and TMODB can be selected as desired through the SEL signal. Thus, it is possible to change the time period for switching the state of the MOD signal, from a shorter one to a longer one.

When this two-modulus variable frequency-divider circuit 30 is used in a frequency synthesizer, the SEL signal is fixed to LOW if the programmable frequency-divider circuit used in combination with the circuit 30 is of the type which detects and responds to a transition of the output OUT of the circuit 30 from LOW to HIGH. Then, the signal applied from the ÷2 frequency-divider 13B to the NAND circuit 14B is the inverted version of N3, i.e. N5B, so the time period allowed for the programmable frequency-divider circuit to switch the state of the MOD signal is advantageously T21.

On the other hand, if the programmable frequency-divider circuit is of the type which detects and responds to a transition of the output of the circuit 30 from HIGH to LOW, the SEL signal is fixed to HIGH. Then the signal applied from the ÷2 frequency-divider 13B to the NAND circuit 14B is N3 or N5A, so the time period available to the programmable frequency-divider circuit for switching the state of the MOD signal is advantageously T12.

As stated above, in the two-modulus variable frequency-divider circuit according to the present invention, the time period available for the switching of the state of the MOD signal after a level change has occurred in the output of the circuit can be changed by means of the externally applied SEL signal. Therefore, if this two-modulus variable frequency-divider circuit is used in a frequency synthesizer, the programmable frequency-divider circuit to be used in combination with the two-modulus variable frequency-divider circuit need not have a high-speed MOD signal state switching characteristic. Therefore, a programmable frequency-divider circuit which can switch the state of the MOD signal only at a relatively low speed can be used, which enables low cost manufacturing of frequency synthesizers, particularly, frequency synthesizers for high frequency applications.

What is claimed is:

1. A two-modulus variable-frequency divider circuit and a subsequent frequency divider circuit with respectively different response times, comprising:

a variable-frequency divider having an input for receiving a signal to be frequency divided and having a frequency dividing factor that can be selectively set to a particular one of at least two values in accordance with a frequency dividing factor setting signal;

a divide by $2^N$ frequency-divider arrangement having an input for receiving a frequency divided output from said variable-frequency divider, said divide by $2^N$ frequency-divider arrangement comprising a number, N, of divide by 2 frequency dividers, where N is an integer;

an output;

a monitor for monitoring an output of at least one of said divide by 2 frequency dividers of said divide by $2^N$ frequency-divider arrangement, a monitor output from said monitor being fed back to said variable-frequency-divider as said frequency dividing factor setting signal;

an output signal converting circuit connected between the output of said divide by $2^N$ frequency-divider arrangement and said output of said two-modulus variable-frequency divider circuit;

said output signal converting circuit including means for selectively making effective inverting or non-inverting said output of said divide by $2^N$ frequency-divider arrangement;

a subsequent frequency divider circuit having a slower response time than said two-modulus variable frequency divider circuit receiving an output of said output signal converting circuit; and said means for selectively inverting or non-inverting being settable at either of its conditions to make effective a one of a positive-going and a negative-going change in condition of said output of said divide by $2^N$ frequency-divider arrangement which provides a maximum time for said subsequent frequency dividing circuit to respond to said frequency divided output, whereby slower response components may be used in said subsequent frequency dividing circuit.

2. A two-modulus variable-frequency divider circuit and a subsequent frequency divider circuit with respectively different response times, comprising:

a variable-frequency divider having an input for receiving a signal to be frequency divided and having a frequency dividing factor that can be selectively set to a particular one of at least two values in accordance with a frequency dividing factor setting signal; a divide by $2^N$ frequency-divider arrangement having an input for receiving a frequency divided output from said variable-frequency divider, said divide by $2^N$ frequency-divider arrangement comprising a number, N, of divide by 2 frequency dividers, where N is an integer;

an output;

a monitor for monitoring an output of at least one of said divide by 2 frequency dividers of said divide by $2^N$ frequency-divider arrangement, a monitor output from said monitor being fed back to said variable-frequency divider as said frequency dividing factor setting signal;

a signal converting circuit connected between said monitor and the output of the final one of those divide by 2 frequency dividers of said divide by $2^N$ frequency-divider arrangement which provides output to said monitor;

said signal converting circuit including means for selectively inverting or non-inverting said frequency divided output from said final one of said divide by 2 frequency dividers in said divide by $2^N$ frequency-divider arrangement; and said means for selectively inverting or non-inverting being settable at either of its conditions to make effective a one of a positive-going and a negative-going change in condition of said output of said divide by $2^N$ frequency-divider arrangement so that a frequency divider circuit having relatively slow response time components is connected subsequent to said output of said two-modulus variable frequency divider circuit having relatively fast response time components can respond with a maximum response time to said one change in condition of said output of said divide by $2^N$ frequency divider arrangement.

3. A two-modulus variable-frequency divider circuit according to claim 1 or 2, wherein said means for selectively inverting includes means for permitting selection of one of its inverting and non-inverting conditions in response to a control signal externally applied thereto.

4. A two-modulus variable frequency-divider circuit according to claim 1 or 2, wherein said $\div 2^N$ frequency-divider arrangement comprises two $\div 2$ frequency-dividers, and said monitor receives outputs from said two $\div 2$ frequency-dividers and a control signal applied from a circuit succeeding said two-modulus variable frequency-divider circuit to produce said monitor output.

5. A two-modulus variable frequency-divider circuit according to claim 3, wherein said $\div 2^N$ frequency-divider arrangement comprises two $\div 2$ frequency-dividers, and said monitor receives outputs from said two $\div 2$ frequency-dividers and a control signal applied from a circuit succeeding said two-modulus variable frequency-divider circuit to produce said monitor output.

6. A two-modulus variable frequency-divider circuit according to claim 1, wherein the final stage $\div 2$ frequency-dividers of said $\div 2^N$ frequency-divider arrangement includes a non-inverted output terminal and an inverted output terminal, and said signal converting circuit selectively couples said non-inverted and inverted output terminals to said output of said two-modulus variable frequency-divider circuit in accordance with a control signal externally applied thereto.

7. A two-modulus variable frequency-divider circuit comprising:
a variable-frequency divider having an input for receiving a signal to be frequency divided and having a frequency dividing factor that can be selectively set to a particular one of at least two values in accordance with a frequency dividing factor setting signal;
a divide by $2^N$ frequency-divider arrangement having an input for receiving a frequency divided output from said variable-frequency divider, said divide by $2^N$ frequency-divider arrangement comprising a number, N, of divide by 2 frequency dividers, where N is an integer;
an output;
a monitor for monitoring an output of at least one of said divide by 2 frequency dividers of said divide by $2^N$ frequency-divider arrangement, a monitor output from said monitor being fed back to said variable-frequency divider as said frequency dividing factor setting signal;
a signal converting circuit connected between said monitor and the output of the final one of those divide by 2 frequency dividers of said divide by $2^N$ frequency-divider arrangement which provides output to said monitor;
said signal converting circuit including means for selectively inverting or non-inverting said frequency divided output from said final one of said divide by 2 frequency dividers in said divide by $2^N$ frequency divider arrangement; and
said means for selectively inverting or non-inverting being settable at either of its conditions to make effective a one of a positive-going and a negative-going change in condition of said output of said divide by $2^N$ frequency-divider arrangement so that a frequency divider circuit connected subsequent to said output of said two-modulus variable frequency divider circuit can respond with a maximum response time to said one change in condition of said output of said divide by $2^N$ frequency divider arrangement, whereby slower response components can be used in said subsequent frequency divider circuit;
said final one of those divide by 2 frequency dividers of said divide by $2^N$ frequency divider arrangement which provide outputs to said monitor includes a non-inverted output terminal and an inverted output terminal, and said signal converting circuit selectively couples said non-inverted and inverted output terminals to said monitor in accordance with a control signal externally applied.

8. A frequency-divider circuit and a subsequent frequency divider circuit with respectively different response times for dividing a high-frequency signal to produce a reference signal related to said high-frequency signal by an integer division ratio, comprising:
a two-modulus variable-frequency divider;
means in said two-modulus variable-frequency divider for receiving a modulus control signal;
said modulus control signal having first and second conditions;
said two-modulus variable-frequency divider being responsive for producing an output signal for a first predetermined number of cycles of said high-frequency signal when said modulus control signal is in said first condition;
said two-modulus variable-frequency divider being further responsive for producing an output signal for a second predetermined number of cycles of said high-frequency signal when said modulus control signal is in said second condition;
a subsequent circuit having a slower response time than said two-modulus variable frequency divider circuit receiving said output signal and producing said reference signal in response to a first predetermined number of cycles of said output signal;
said subsequent circuit being effective for producing a MOD signal after a second predetermined number of cycles of said output signal;
said second predetermined number being less than said first predetermined number;
a monitor;
said monitor receiving said MOD signal;
at least one divide-by-two counter in said two-modulus variable-frequency divider;
an output of said at least one divide-by-two counter being connected to said monitor;
an output of said monitor being said modulus control signal; and
means for maximizing a period during which said subsequent circuit must respond to said output signal, whereby lower cost components may be used in said subsequent circuit.

9. Apparatus according to claim 8, wherein said means for maximizing includes:
means for selectively inverting said output signal; and
said means for selectively inverting being set for one of inverting and non-inverting depending on a condition providing a maximum time for said subsequent circuit to produce said MOD signal.

10. Apparatus according to claim 8, wherein said means for maximizing includes:

means for selectively inverting said output of said at least one divide-by-two counter; and said means for selectively inverting being set for one of inverting and non-inverting depending on a condition providing a maximum time for said subsequent circuit to produce said MOD signal.

11. Apparatus according to claim 9 or 10, wherein said means for selectively inverting includes means responsive to external control for selecting said inverting or non-inverting condition.

* * * * *